US010418329B2

(12) United States Patent
Li et al.

(10) Patent No.: US 10,418,329 B2
(45) Date of Patent: Sep. 17, 2019

(54) MICROELECTRONIC STRUCTURES HAVING MULTIPLE MICROELECTRONIC DEVICES CONNECTED WITH A MICROELECTRONIC BRIDGE EMBEDDED IN A MICROELECTRONIC SUBSTRATE

(71) Applicant: Intel Corporation, Santa Clara, CA (US)

(72) Inventors: Eric J. Li, Chandler, AZ (US);
Timothy A. Gosselin, Phoenix, AZ (US); Yoshihiro Tomita, Ibaraki (JP);
Shawna M. Liff, Scottsdale, AZ (US);
Amram Eitan, Scottsdale, AZ (US);
Mark Saltas, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/774,937

(22) PCT Filed: Dec. 11, 2015

(86) PCT No.: PCT/US2015/065165
§ 371 (c)(1),
(2) Date: May 9, 2018

(87) PCT Pub. No.: WO2017/099788
PCT Pub. Date: Jun. 15, 2017

(65) Prior Publication Data
US 2018/0337129 A1    Nov. 22, 2018

(51) Int. Cl.
*H01L 23/538* (2006.01)
*H01L 23/48* (2006.01)
(Continued)

(52) U.S. Cl.
CPC ...... *H01L 23/5381* (2013.01); *H01L 21/4853* (2013.01); *H01L 21/561* (2013.01);
(Continued)

(58) Field of Classification Search
CPC ............. H01L 2224/97; H01L 25/0657; H01L 2224/32145; H01L 21/565;
(Continued)

(56) References Cited

U.S. PATENT DOCUMENTS 9,000,586 B2    4/2015   Do et al.
2012/0261838 A1  10/2012  Braunisch et al.
(Continued)

FOREIGN PATENT DOCUMENTS

KR    10-20140060435    5/2014

OTHER PUBLICATIONS

International Search Report and Written Opinion for International Patent Application No. PCT/US15/65165, dated Aug. 18, 2016.
(Continued)

*Primary Examiner* — Jasmine J Clark
(74) *Attorney, Agent, or Firm* — Green, Howard & Mughal LLP.

(57) ABSTRACT

A microelectronic structure includes a microelectronic substrate having a first surface and a cavity extending into the substrate from the microelectronic substrate first surface, a first microelectronic device and a second microelectronic device attached to the microelectronic substrate first surface, and a microelectronic bridge disposed within the microelectronic substrate cavity and attached to the first microelectronic device and to the second microelectronic device. In one embodiment, the microelectronic structure may include a reconstituted wafer formed from the first microelectronic device and the second microelectronic device. In another embodiment, a flux material may extend between the first
(Continued)

microelectronic device and the microelectronic bridge and between the second microelectronic device and the microelectronic bridge.

23 Claims, 10 Drawing Sheets

(51) Int. Cl.
*H01L 23/13* (2006.01)
*H01L 21/56* (2006.01)
*H01L 23/00* (2006.01)
*H01L 25/065* (2006.01)
*H01L 21/48* (2006.01)
*H01L 23/31* (2006.01)

(52) U.S. Cl.
CPC ............ *H01L 21/563* (2013.01); *H01L 23/13* (2013.01); *H01L 23/3157* (2013.01); *H01L 23/48* (2013.01); *H01L 23/5385* (2013.01); *H01L 24/14* (2013.01); *H01L 24/17* (2013.01); *H01L 24/32* (2013.01); *H01L 24/73* (2013.01); *H01L 24/92* (2013.01); *H01L 24/95* (2013.01); *H01L 24/96* (2013.01); *H01L 25/0655* (2013.01); *H01L 21/568* (2013.01); *H01L 23/5383* (2013.01); *H01L 24/11* (2013.01); *H01L 24/13* (2013.01); *H01L 24/16* (2013.01); *H01L 24/27* (2013.01); *H01L 24/48* (2013.01); *H01L 24/81* (2013.01); *H01L 24/83* (2013.01); *H01L 2224/11002* (2013.01); *H01L 2224/1182* (2013.01); *H01L 2224/131* (2013.01); *H01L 2224/14134* (2013.01); *H01L 2224/14177* (2013.01); *H01L 2224/16148* (2013.01); *H01L 2224/16227* (2013.01); *H01L 2224/16238* (2013.01); *H01L 2224/1701* (2013.01); *H01L 2224/1703* (2013.01); *H01L 2224/27002* (2013.01); *H01L 2224/3201* (2013.01); *H01L 2224/32145* (2013.01); *H01L 2224/32225* (2013.01); *H01L 2224/48227* (2013.01); *H01L 2224/73104* (2013.01); *H01L 2224/73204* (2013.01); *H01L 2224/81005* (2013.01); *H01L 2224/81011* (2013.01); *H01L 2224/81191* (2013.01); *H01L 2224/81193* (2013.01); *H01L 2224/81203* (2013.01); *H01L 2224/83005* (2013.01); *H01L 2224/83102* (2013.01); *H01L 2224/83104* (2013.01); *H01L 2224/92125* (2013.01); *H01L 2224/95* (2013.01); *H01L 2224/95001* (2013.01); *H01L 2224/96* (2013.01); *H01L 2924/15153* (2013.01); *H01L 2924/181* (2013.01); *H01L 2924/18161* (2013.01)

(58) Field of Classification Search
CPC ....... H01L 2224/73204; H01L 25/0652; H01L 2224/49175; H01L 24/81; H01L 23/5381; H01L 23/3157; H01L 23/5385; H01L 23/13; H01L 23/48; H01L 23/5383; H01L 24/96; H01L 24/95; H01L 24/92; H01L 24/73; H01L 24/32; H01L 24/17; H01L 24/14; H01L 2224/14177; H01L 2224/11002; H01L 2224/1182; H01L 2224/83104; H01L 2224/96; H01L 2224/95001; H01L 2224/95; H01L 2224/92125; H01L 2224/83102; H01L 2224/81203; H01L 2224/81193; H01L 2224/81191; H01L 2224/81005; H01L 2224/73104; H01L 2224/48227; H01L 2224/32225; H01L 2224/3201; H01L 2224/1703; H01L 21/4853; H01L 25/0655; H01L 2924/18161; H01L 2924/15153; H01L 2224/16238; H01L 2224/16227; H01L 2224/16148; H01L 2224/131; H01L 2224/14134; H01L 2224/1701; H01L 2924/181; H01L 2224/27002; H01L 2224/81011; H01L 2224/83005; H01L 24/83; H01L 24/48; H01L 24/27; H01L 24/16; H01L 24/13; H01L 24/11; H01L 21/568
See application file for complete search history.

(56) References Cited

U.S. PATENT DOCUMENTS

| 2014/0174807 | A1 | 6/2014 | Roy et al. | |
|---|---|---|---|---|
| 2014/0252599 | A1 | 9/2014 | Kwon et al. | |
| 2014/0264791 | A1 | 9/2014 | Manusharow et al. | |
| 2015/0364422 | A1* | 12/2015 | Zhai | H01L 21/768 257/773 |
| 2016/0071818 | A1* | 3/2016 | Wang | H01L 25/0655 257/774 |

OTHER PUBLICATIONS

International Preliminary Report on Patentability for International Patent Application No. PCT/US15/65165, dated Jun. 21, 2018.

* cited by examiner

MICROELECTRONIC STRUCTURES HAVING MULTIPLE MICROELECTRONIC DEVICES CONNECTED WITH A MICROELECTRONIC BRIDGE EMBEDDED IN A MICROELECTRONIC SUBSTRATE

CLAIM OF PRIORITY

This Application is a National Stage Entry of, and claims priority to, PCT Application No. PCT/US15/65165, filed on Dec. 11, 2015 and entitled "MICROELECTRONIC STRUCTURES HAVING MULTIPLE MICROELECTRONIC DEVICES CONNECTED WITH A MICROELECTRONIC BRIDGE EMBEDDED IN A MICROELECTRONIC SUBSTRATE", which is incorporated by reference in its entirety for all purposes.

TECHNICAL FIELD

Embodiments of the present description generally relate to the field of microelectronic package fabrication, and, more particularly, to a microelectronic structure including a bridge embedded in a substrate for electrical signal connection between microelectronic devices and to methods of fabricating the same.

BACKGROUND

The microelectronic industry is continually striving to produce ever faster and smaller microelectronic packages for use in various electronic products. As part of this effort, microelectronic packages containing multiple devices, such a microelectronic dice, have been developed. These multiple microelectronic device packages are referred to in the art as multi-device or multi-chip packages (MCPs) and offer the potential for increased architectural flexibility at reduced cost, but must do so such that appropriate microelectronic device-to-microelectronic device interconnect densities are provided. As will be understood to those skilled in the art, interconnect density is an important consideration because an insufficient number of microelectronic device connections would limit the bandwidth capability for the affected microelectronic device interface, and thus would reduce the communication efficiency and capability between microelectronic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
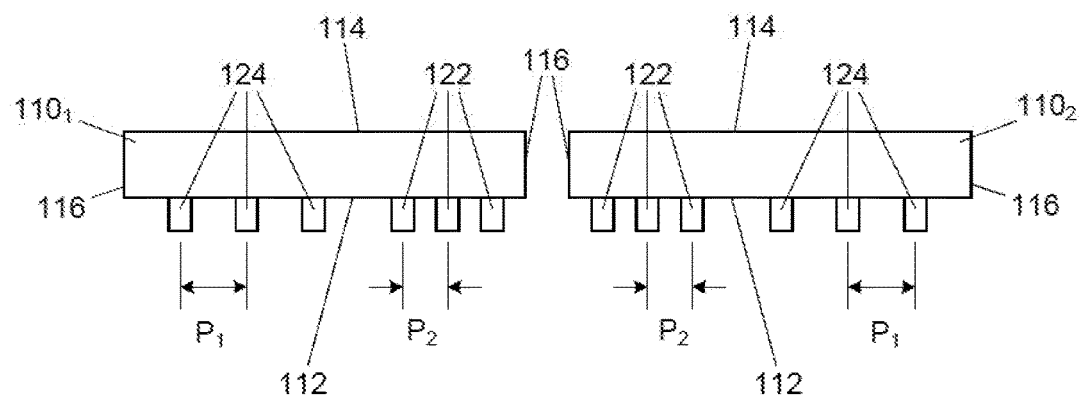
FIG. 1-10 illustrate cross-sectional views of a method for fabricating a microelectronic structure including at least two microelectronic devices electrically connected with bridge, wherein the bridge resides within a cavity in a microelectronic substrate to which the microelectronic devices are electrically attached, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include fabricating a microelectronic structure comprising forming a first and a second microelectronic device, wherein each of the first and the second microelectronic device include a plurality of high density interconnect structures and a plurality of lower density interconnect structures on an active surface thereof, attaching a microelectronic bridge to the plurality of high density interconnect structures of the first microelectronic device and to the plurality of high density interconnect structures of the second microelectronic device, forming a microelectronic substrate having a cavity extending into the microelectronic substrate from a first surface thereof, and electrically attaching the plurality of lower density interconnect structures of the first microelectronic device and the plurality of lower density interconnect structures of the second microelectronic device to the first surface of the microelectronic substrate, wherein the microelectronic bridge extends into the microelectronic substrate cavity.

Embodiments of the present description may enable density scaling of structures within a microelectronic package that may represent a significant improvement over existing technology generations by making use of microelectronic bridges that are embedded in the microelectronic substrate. These microelectronic bridges support dense microelectronic device-to-microelectronic device interconnection from a first microelectronic device to a second microelectronic device. Thus, a resulting microelectronic package may be considerably smaller than a microelectronic package that is only interconnected with conductive routes within the microelectronic substrate.

FIGS. 1-11 illustrate a method of fabricating a microelectronic structure, according on one embodiment of the present description. As shown in FIG. 1, plurality of microelectronic devices, shown as a first microelectronic device $110_1$ and a second microelectronic device $110_2$, may be formed, wherein each microelectronic device $110_1$, $110_2$ may include an active surface 112, an opposing back surface 114, and at least one side 116 extending between the microelectronic device active surface 112 and the microelectronic device back surface 114. Each microelectronic device $110_1$, $110_2$ may include a plurality of high density interconnect structures 122, such as bumps or pillars, and a plurality of lower density interconnect structures 124, such as bumps or pillars, on the microelectronic device active surface 112. It is understood that the high density interconnect structures 122 and the lower density interconnect structures 124 may be in electrical communication with integrated circuitry (not shown) within the first microelectronic device $110_1$ and the second microelectronic device $110_2$. The first microelectronic device $110_1$ and the second microelectronic device $110_2$ may be any appropriate microelectronic device, such as microelectronic dice, including, but not limited to a microprocessor, a chipset, a graphics device, a wireless device, a memory device, an application specific integrated circuit device, and the like.

As defined for purposes of the present description, the term "lower density" in "lower density interconnect structures" is relative to the term "high density" in "high density interconnect structures" in that the lower density interconnect structures 124 have a greater pitch/spacing P1 between the lower density interconnect structures 124 than a pitch/spacing P2 between the high density interconnect structures 122, and vice versa.

Figure 2:
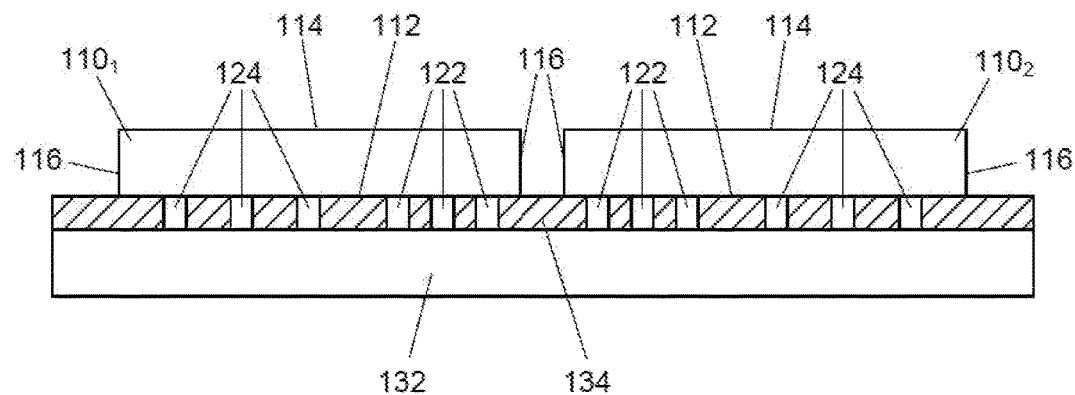

As shown in FIG. 2, the first microelectronic device $110_1$ and the second microelectronic device $110_2$ may be aligned on a carrier 132. In one embodiment, the first microelectronic device $110_1$ and the second microelectronic device $110_2$ may be aligned with their active surfaces 112 facing the carrier 132 and secured in place with an adhesive layer 134 disposed between the carrier 132 and the active surfaces 112 of the first microelectronic device $110_1$ and the second microelectronic device $110_2$. In an embodiment, the first microelectronic device $110_1$ and the second microelectronic device $110_2$ may be aligned such that the plurality of high density interconnect structures 122 of the first microelectronic device $110_1$ are directly adjacent the high density interconnect structures 122 of the second microelectronic device $110_2$. As will be understood to those skilled in the art, precision pick and place equipment may be utilized with pre-defined spacing and orientation to assure proper alignment.

Figure 3:
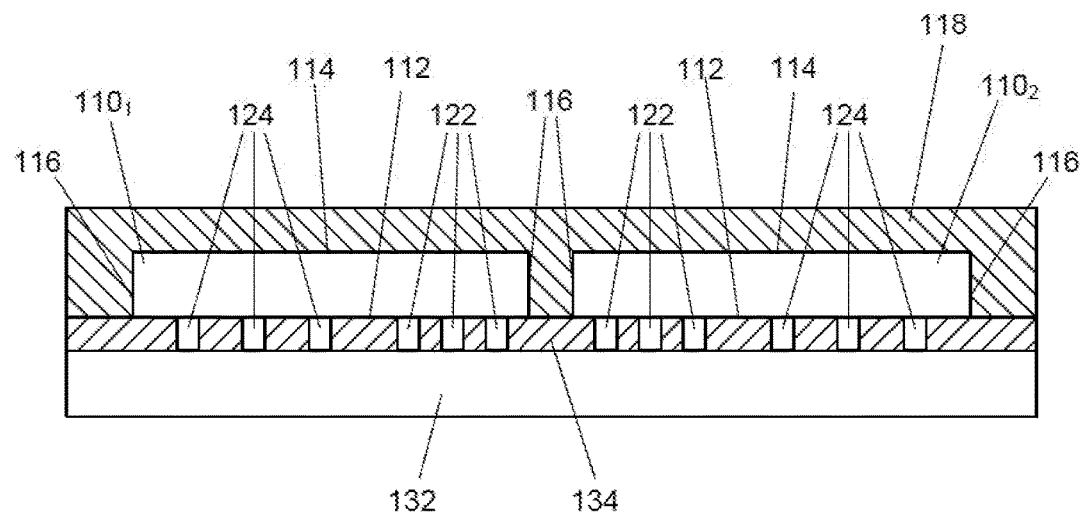

As shown in FIG. 3, an encapsulant material 118 may be deposited over the first microelectronic device $110_1$ and the second microelectronic device $110_2$, such that the encapsulant material 118 contacts the back surfaces 114 and sides 116 of the first microelectronic device $110_1$ and the second microelectronic device $110_2$. In one embodiment, wafer level compression molding with low coefficient of thermal expansion material may be used to deposit the encapsulant material 118. The encapsulant material 118 may be any appropriate material, including, but not limited to, polymer materials with or with appropriate fillers.

Figure 4:
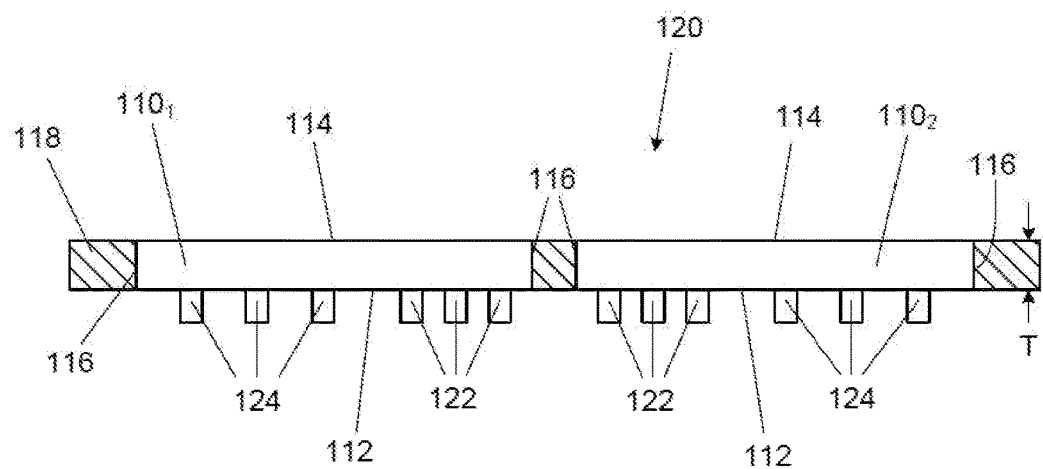

As shown in FIG. 4, the encapsulant material 118 may be cured or partially cured and the structure may be thinned by removing a portion of the encapsulant material 118 adjacent to back surfaces 114 of the first microelectronic device $110_1$ and the second microelectronic device $110_2$ to expose the back surfaces 114 thereof. This removal leaves the encapsulant material 118 contacting the sides 116 of the first microelectronic device $110_1$ and the second microelectronic device $110_2$, thereby forming a structure which is referred to as a reconstituted wafer 120. It is understood that a portion of the first microelectronic device $110_1$ and the second microelectronic device $110_2$ may be removed during or after the removal of the portion of the encapsulant material 118 to reduce the thickness T of the reconstituted wafer 120. In one embodiment, the removal of the portion of the encapsulant material 118 and the removal of the portion of the first microelectronic device $110_1$ and the second microelectronic device $110_2$ may be performed before the carrier 132 (see FIG. 4) and adhesive layer 134 (see FIG. 4) are removed. In another embodiment, the removal of the portion of the encapsulant material 118 and the removal of the portion of the first microelectronic device $110_1$ and the second microelectronic device $110_2$ may be performed after the carrier 132 (see FIG. 4) and adhesive layer 134 (see FIG. 4) are removed, wherein the first microelectronic device $110_1$ and the second microelectronic device $110_2$ may be attached to a backgrinding tape (not shown) prior to the removal of the portion of the encapsulant material 118 and the removal of the portion of the first microelectronic device $110_1$ and the second microelectronic device $110_2$. The removal of the portion of the encapsulant material 118 and the removal of the portion of the first microelectronic device $110_1$ and the second microelectronic device $110_2$ may be achieved by any technique known in the art, including but not limited to mechanical grinder, etching, chemical mechanical planarization, and the like. As will be understood to those skilled in the art, the material removal may improve thermal performance and may planarize the reconstituted wafer 120.

Figure 5:
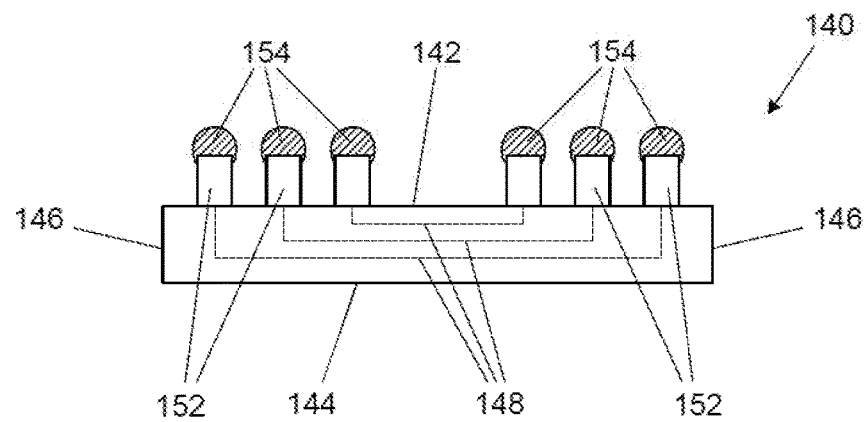

As shown in FIG. 5, a microelectronic bridge 140 may be formed comprising a first surface 142, an opposing second surface 144, and at least one side 146 extending between the first surface 142 and the second surface 144. The microelectronic bridge 140 may include a plurality of interconnect structures 152, such as bumps or pillars, on the microelectronic bridge first surface 142. As illustrated, the microelectronic bridge 140 may include a plurality of conductive routes 148 formed therein to connect respective microelectronic bridge interconnect structures 152. As further illustrated, a solder material 154 may be applied on the interconnect structures 154 by any appropriate process known in the art, such as with a fine, but uniform pitch using a plating technique.

Figure 6:
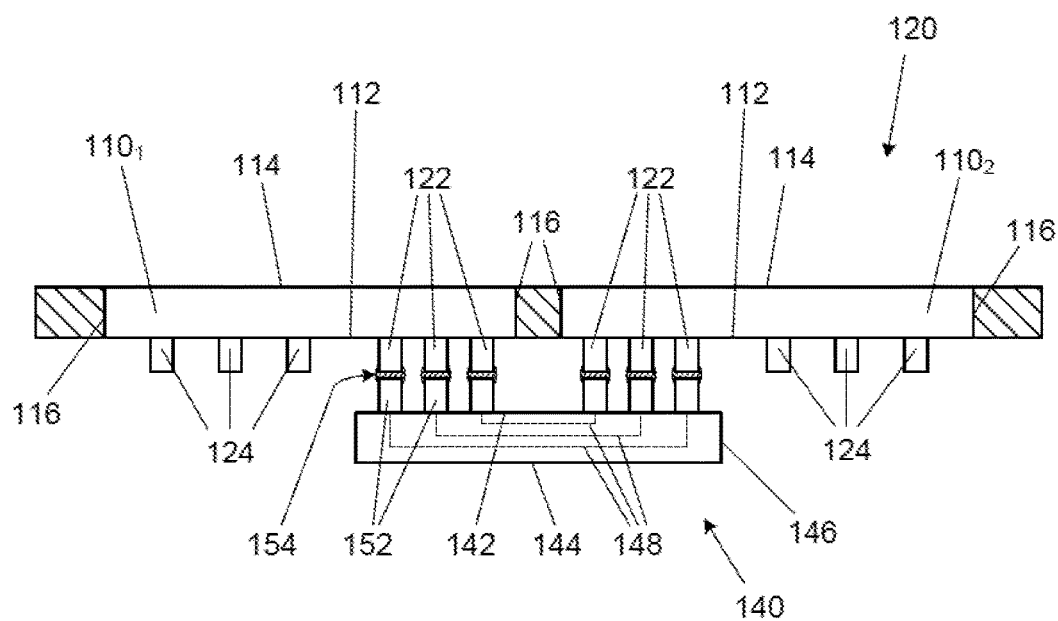

As shown in FIG. 6, the microelectronic bridge 140 may be attached to the high density interconnect structures 122 of the first microelectronic devices 110$_1$ and to the high density interconnect structures 122 of the second microelectronic device 110$_2$ to form an electrical connection therebetween. In one embodiment, the plurality of interconnect structures 152 of the microelectronic bridge 140 are in a mirror-image configuration to the plurality of high density interconnect structures 122 of the first microelectronic device 110$_1$ and the second microelectronic device 110$_2$, and are attached thereto with the solder material 154 by thermocompression bonding. In another embodiment, the microelectronic bridge 140 may be attached with a traditional chip attach module process despite the high density/fine pitch of the microelectronic bridge interconnect structures 152, when a low coefficient of the thermal expansion encapsulant material 118 is utilized, so the thermal expansion mismatch between the microelectronic bridge 140 and the reconstituted wafer 120 is minimal. The processes and materials use for forming the microelectronic bridge 140 are well known in the art, and, for the sake of brevity and conciseness, will not be described or illustrated herein.

Figure 7:
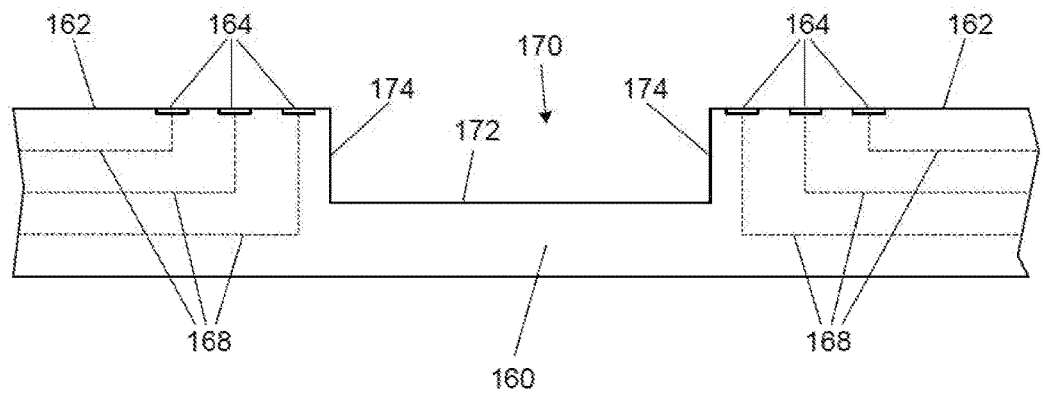

As shown in FIG. 7, a microelectronic substrate 160 may be formed having a cavity 170 therein that extends into the microelectronic substrate 160 from a first surface 162 thereof, wherein the microelectronic substrate cavity 170 is defined by at least one sidewall 174 and a bottom surface 172. The microelectronic substrate 160 may further include a plurality of bond pads 164 formed in or on the microelectronic substrate first surface 162. The microelectronic substrate cavity 170 may be formed by any known technique known in the art, including, but not limited to, laser ablation, controlled depth routing, etching, and the like.

The microelectronic substrate 160 may be any appropriate microelectronic substrate, including, but not limited to, an interposer, a motherboard, and the like. Further, the microelectronic substrate 160 may comprise a plurality of dielectric layers (not shown) having the plurality of conductive routes 148 formed from conductive traces (not shown) formed on the dielectric layers (not shown) that at connected with conductive vias (not shown) formed through the dielectric layers (not shown). The processes and materials use for forming the microelectronic substrate 160 are well known in the art, and, for the sake of brevity and conciseness, will not be described or illustrated herein.

Figure 8:
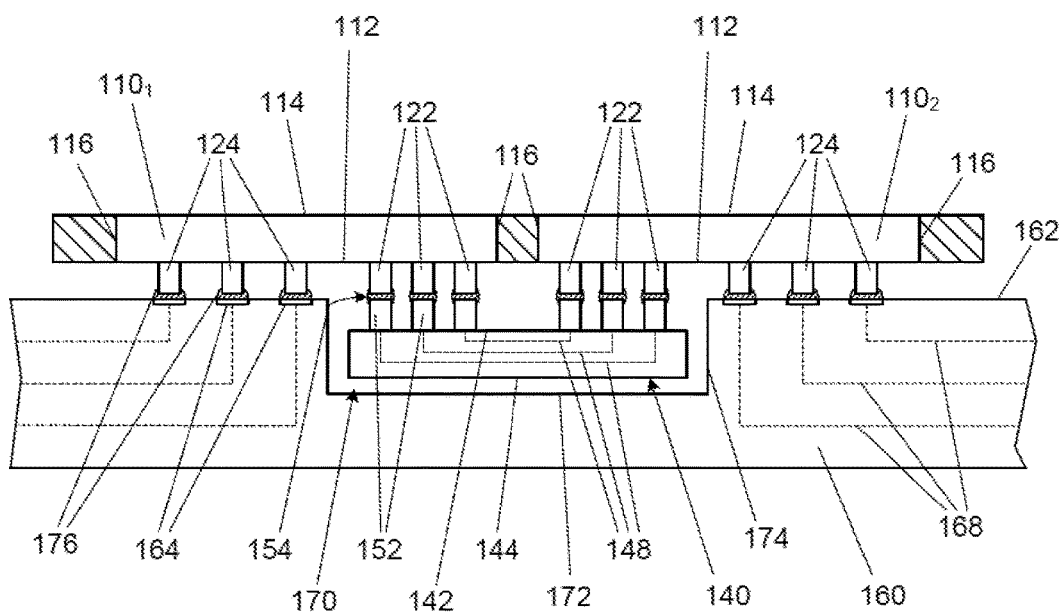

As shown in FIG. 8, the structure of FIG. 6 may be attached to the microelectronic substrate 160, wherein the plurality of lower density interconnect structures 124 of the first microelectronic device 110$_1$ and the plurality of lower density interconnect structures 124 of the second microelectronic device 110$_2$ may be electrically attached to the plurality of substrate bond pads 164 formed in or on the microelectronic substrate first surface 162, wherein the microelectronic bridge 140 extends into the microelectronic substrate cavity 170. In one embodiment, the plurality of lower density interconnect structures 124 of the first microelectronic device 110$_1$ and the plurality of lower density interconnect structures 124 of the second microelectronic device 110$_2$ are in a mirror-image configuration to the plurality of microelectronic substrate bond pads 164, and are attached thereto with a solder material 176 by thermocompression bonding. In one embodiment, the solder material 176 may be applied to the plurality of substrate bond pads 164 with a microball process, as known in the art.

Figure 9:
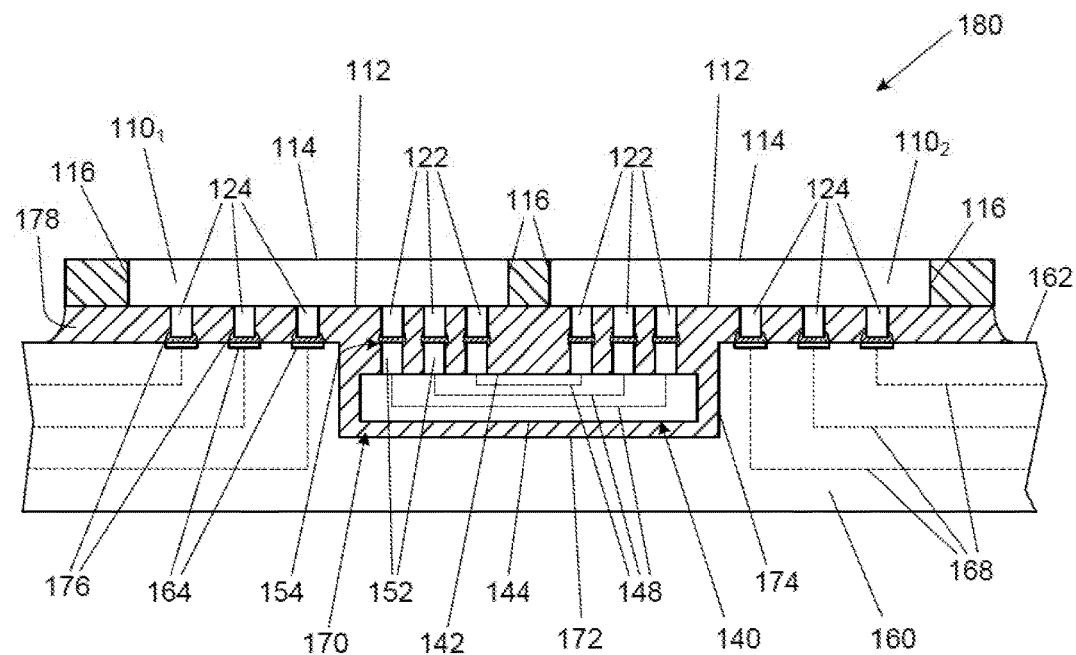
Figure 10:
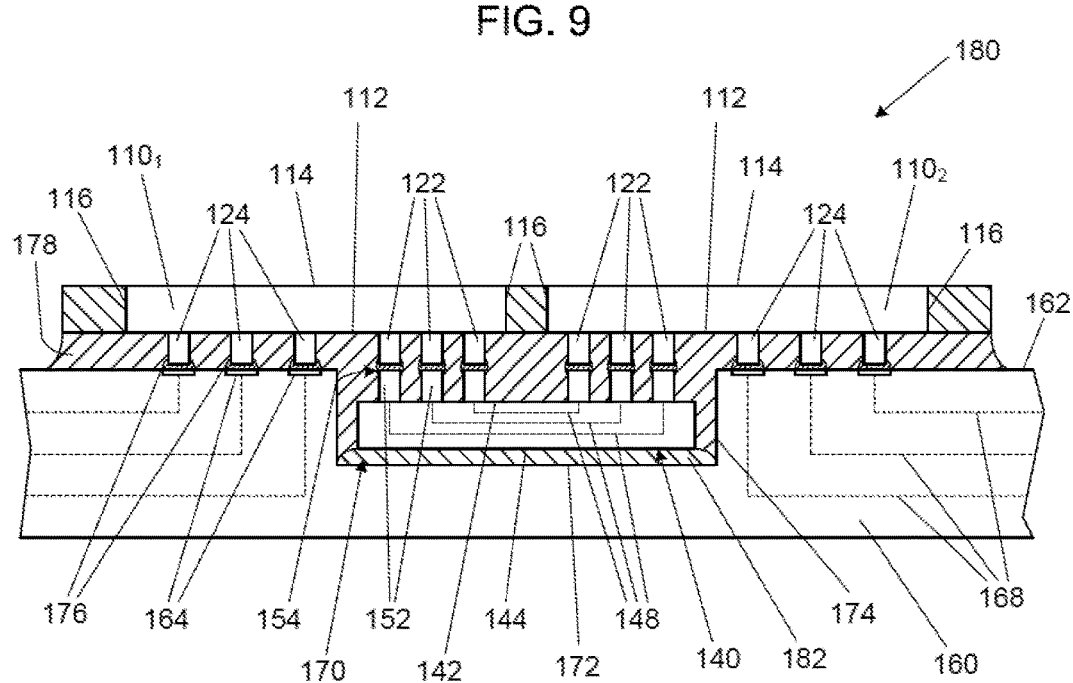

As shown in FIG. 9, an underfill material 178 may be disposed between the active surface 112 of the first microelectronic device 110$_1$ and the microelectronic substrate first surface 162, between the active surface 112 of the second microelectronic device 110$_2$ and the microelectronic substrate first surface 162, and within the microelectronic substrate cavity 170 to form a microelectronic structure 180. In one embodiment, as illustrate in FIG. 9, the underfill material 178 may be disposed between the second surface 144 of the microelectronic bridge 140 and the bottom surface 172 of the cavity 170. In another embodiment, as illustrated in FIG. 10, an adhesive material 182, such as a snap cure epoxy, can be disposed on the bottom surface 174 of the cavity 170 prior to the attachment of the first microelectronic device 110$_1$ and the second microelectronic device 110$_2$ to ensure that material is disposed between the second surface 144 of the microelectronic bridge 140 and the bottom surface 172 of the cavity 170. In an embodiment, a capillary underfill process may be used to dispose the underfill material 178. In another embodiment, a high pressure assisted curing process may be used to dispose the underfill material 178 due the complexity of the space to be filled, as will be understood to those skilled in the art. It is further noted that the underfill material 178 is a single material filling the space, as described.

Figure 11:
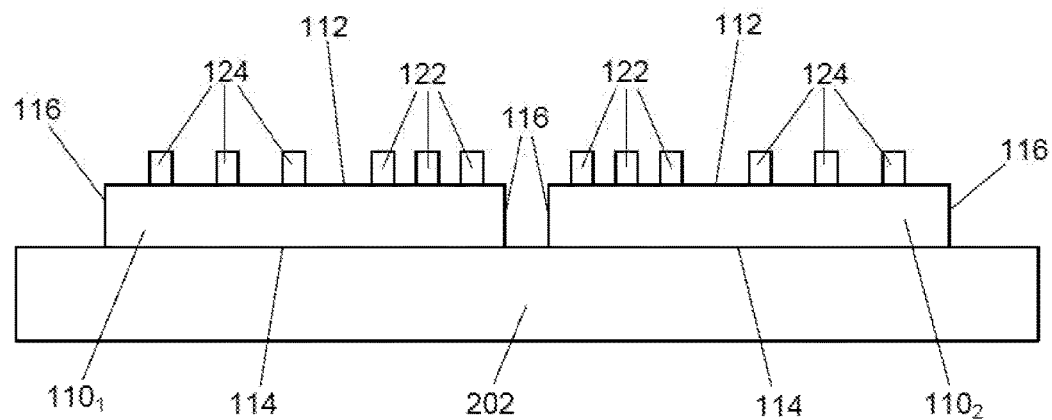
FIG. 11-16 illustrate cross-sectional views of another method for fabricating a microelectronic structure including at least two microelectronic devices electrically connected with bridge, wherein the bridge resides within a cavity in a microelectronic substrate to which the microelectronic devices are electrically attached, according to an embodiment of the present description.

FIGS. 11-16 illustrate a method of fabricating a microelectronic structure, according to another embodiment of the present description. As shown in FIG. 11, the first microelectronic device 110$_1$ and the second microelectronic device 110$_2$, as shown and discussed with regard to FIG. 1, may be aligned in a carrier 202, such as a thermocompression bonding pedestal. In one embodiment, the first microelectronic device 110$_1$ and the second microelectronic device 110$_2$ may be aligned with their back surfaces 114 abutting the carrier 202. In an embodiment, the first microelectronic device 110$_1$ and the second microelectronic device 110$_2$ may be aligned such that the plurality of high density interconnect structures 122 of the first microelectronic device 110$_1$ are directly adjacent the high density interconnect structures 122 of the second microelectronic device 110$_2$. As will be understood to those skilled in the art, precision pick and place equipment may be utilized with pre-defined spacing and orientation to assure proper alignment.

Figure 12:
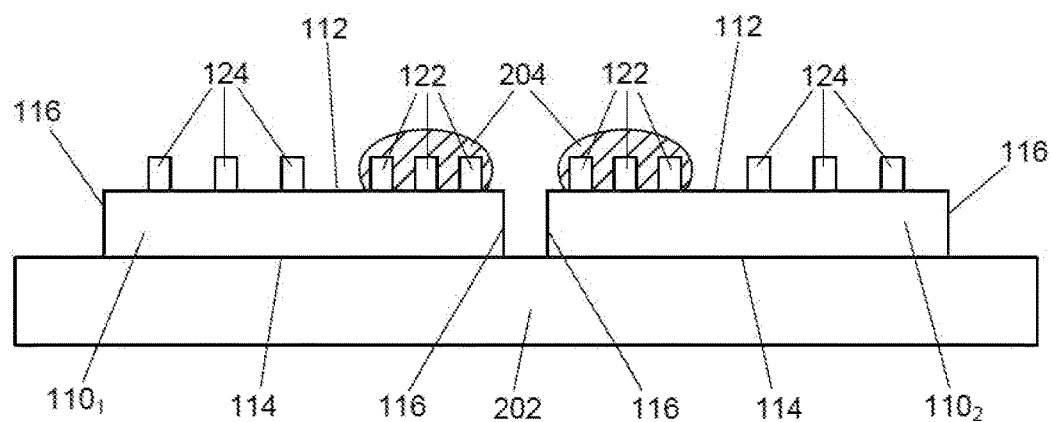
Figure 13:
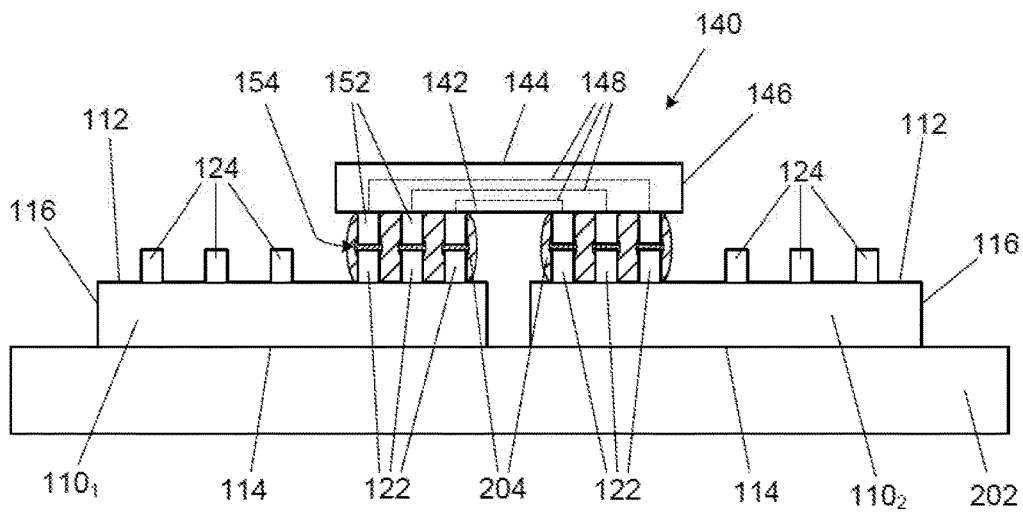

As shown in FIG. 12, a flux material 204, such as an epoxy flux material, may be dispensed onto the high density interconnect structures 122 of the first microelectronic device 110$_1$ and onto the high density interconnect structures 122 of the first microelectronic device 110$_2$. As shown in FIG. 13, the microelectronic bridge 140, as discussed with regard to FIG. 5, may be attached to the high density interconnect structures 122 of the first microelectronic devices 110$_1$ and to the high density interconnect structures 122 of the second microelectronic device 110$_2$ to form an electrical connection therebetween, wherein the flux material 204 extends between the first microelectronic device 110$_1$ and the microelectronic bridge 140, and between on the second microelectronic device 110$_2$ and the microelectronic bridge 140. In one embodiment, the plurality of interconnect structures 152 of the microelectronic bridge 140 are in a mirror-image configuration to the plurality of high density interconnect structures 122 of the first microelectronic device 110$_1$ and the second microelectronic device 110$_2$, and are attached thereto with a solder material 154 by thermocompression bonding.

Figure 14:
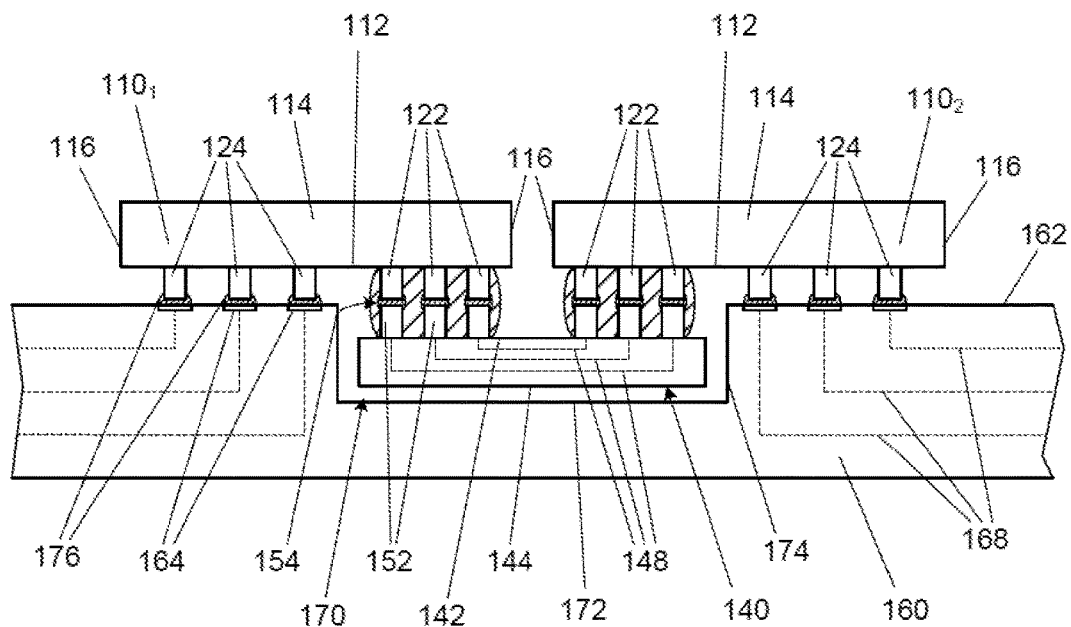

As shown in FIG. 14, the structure of FIG. 13 may be removed from the carrier 202 (see FIG. 13) and may be attached to the microelectronic substrate 160, as discussed with regard to FIG. 7, wherein the plurality of lower density interconnect structures 124 of the first microelectronic device 110$_1$ and the plurality of lower density interconnect structures 124 of the second microelectronic device 110$_2$ may be electrically attached to the plurality of substrate bond pads 164 formed in or on the microelectronic substrate first surface 162, wherein the microelectronic bridge 140 extends into the microelectronic substrate cavity 170. In one embodiment, the plurality of lower density interconnect structures 124 of the first microelectronic device 110$_1$ and the plurality of lower density interconnect structures 124 of the second microelectronic device 110$_2$ are in a mirror-image configuration to the plurality of microelectronic substrate bond pads 164, and are attached thereto with the solder material 176 by thermocompression bonding.

Figure 15:
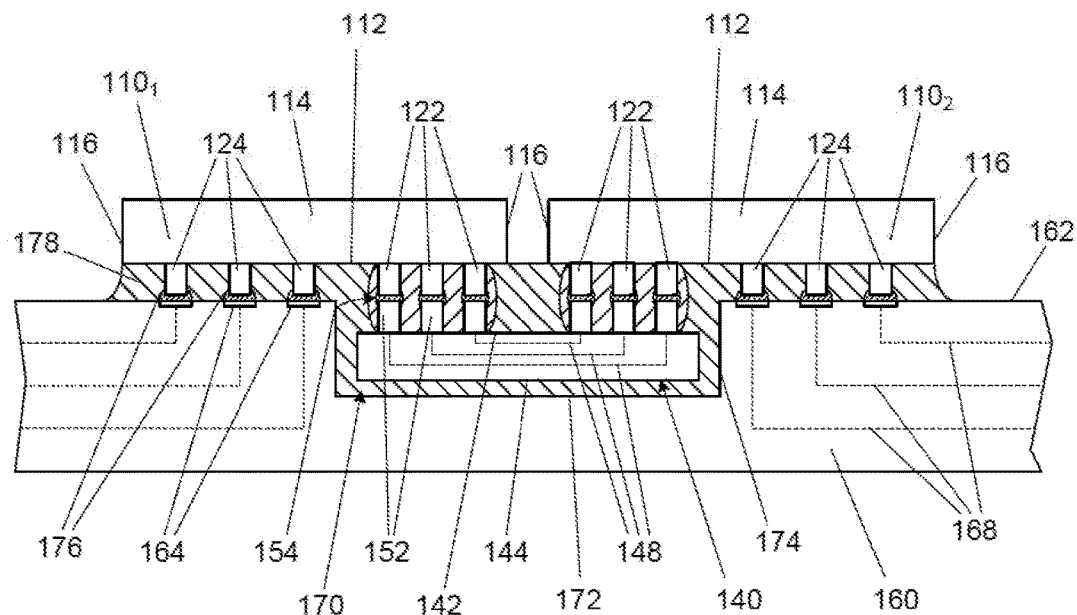

As shown in FIG. 15, the underfill material 178 may be disposed between the active surface 112 of the first microelectronic device 110$_1$ and the microelectronic substrate first surface 162, between the active surface 112 of the second microelectronic device 110$_2$ and the microelectronic substrate first surface 162, and within the microelectronic substrate cavity 170 to form the microelectronic structure 180.

Figure 16:
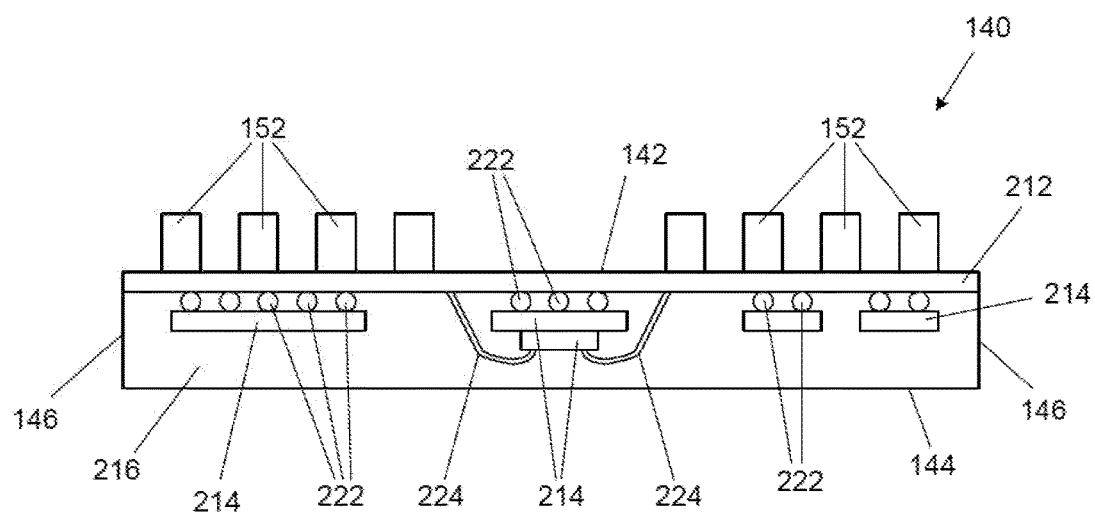

In some embodiments as illustrated in FIGS. 6-10 and 13-15, the microelectronic bridge 140 can be a passive structure, in that it has no functionality other than to provide the conductive routes 148 between the first microelectronic device 110$_1$ and the second microelectronic device 110$_2$. In other embodiments, as shown in FIG. 16, the microelectronic bridge 140 may comprise at least one active component 214, having its own functionality apart from a bridging function, and, thus, may be a microelectronic device, a resistor, a capacitor, and the like, embedded in the microelectronic bridge 140. In one embodiment, as illustrated in FIG. 16, the microelectronic bridge 140 may have a signal routing layer 212 with at least one active component 214 electrically attached to the signal routing layer 212 with solder balls 222 and/or wire bonds 224, wherein the active components 214 may be encapsulated within a dielectric material 216.

It is noted that the process embodiments of the present description attach the microelectronic bridge 140 to the first microelectronic device 110$_1$ and the second microelectronic device 110$_2$ prior to the incorporation thereof with the microelectronic substrate 160. Such processes may have advantages compared to processes wherein the microelectronic bridge 140 is embedded in the microelectronic substrate 160 prior to attaching the first microelectronic device 110$_1$ and the second microelectronic device 110$_2$. For example, if the microelectronic bridge 140 were embedded in the microelectronic substrate 160, it would require the first microelectronic device 110$_1$ and the second microelectronic device 110$_2$ to be simultaneously attached to a mixed pitch interconnects, which would make a one-step process no longer a viable option to produce uniform bump height required by the chip attach process. As will be understood to those skilled in the art, a solder-on-die process or a multi-step lithographic and plating process may be needed. However, the mixed pitch configuration and stringent bump height uniformity requirements make the solder-on-die process very difficult to develop due to process marginality, particularly for larger microelectronic structures.

It is understood that although the detailed description with regard to the embodiments of FIGS. 1-16 are directed to two microelectronic devices 110$_1$ and 110$_2$, one microelectronic bridge 140, and one cavity 170 in the microelectronic substrate 160, the subject matter of the present description is not so limited, as any number of microelectronic devices, microelectronics bridges, and microelectronic substrate cavities may be used. In one embodiment, three microelectronic devices may be attached to a triangular bridge. In another embodiment, six microelectronic devices may be attached to a hexagonal bridge. In a further embodiment, more than one microelectronic bridge may be disposed in a single microelectronic substrate cavity. In yet a further embodiment, multiple cavities may be formed in a single microelectronic substrate.

Figure 17:
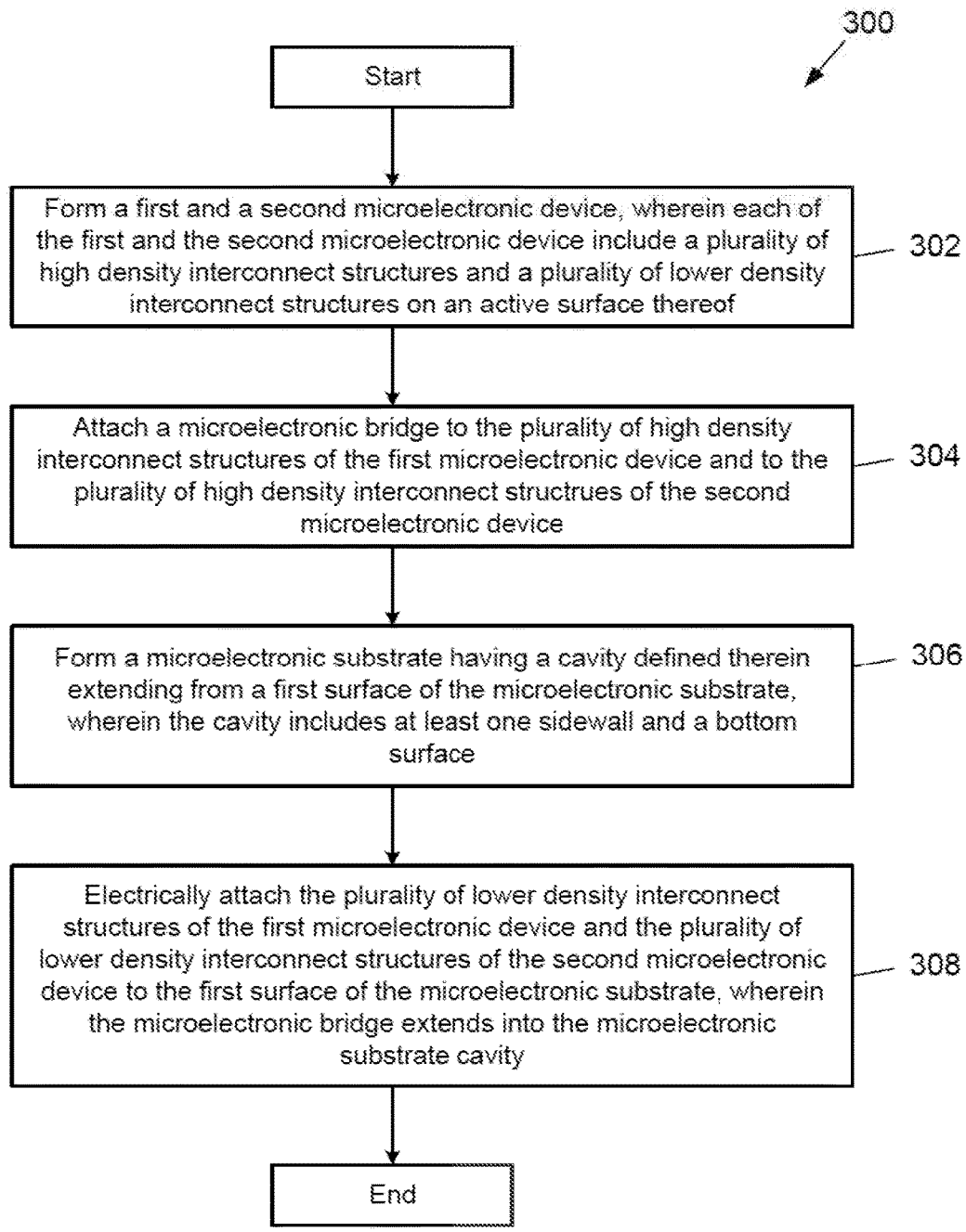
FIG. 17 is a flow chart of a process of fabricating a microelectronic structure according to an embodiment of the present description.

FIG. 17 is a flow chart of a process 300 of fabricating a microelectronic structure according to an embodiment of the present description. As set forth in block 302, a first and a second microelectronic device may be formed, wherein each of the first and the second microelectronic device includes a plurality of high density interconnect structures and a plurality of lower density interconnect structures on an active surface thereof. A microelectronic bridge may be attached to the plurality of high density interconnect structures of the first microelectronic device and to the plurality of high density interconnect structures of the second microelectronic device, as set forth in block 304. As set forth in block 306, a microelectronic substrate may be formed having a cavity defined therein extending from a first surface of the microelectronic substrate, wherein the cavity includes at least one sidewall and a bottom surface. The plurality of lower density interconnect structures of the first microelectronic device and the plurality of lower density interconnect structures of the second microelectronic device may be electrically attached to the first surface of the microelectronic substrate, wherein the microelectronic bridge extends into the microelectronic substrate cavity, as set forth in block 308.

Figure 18:
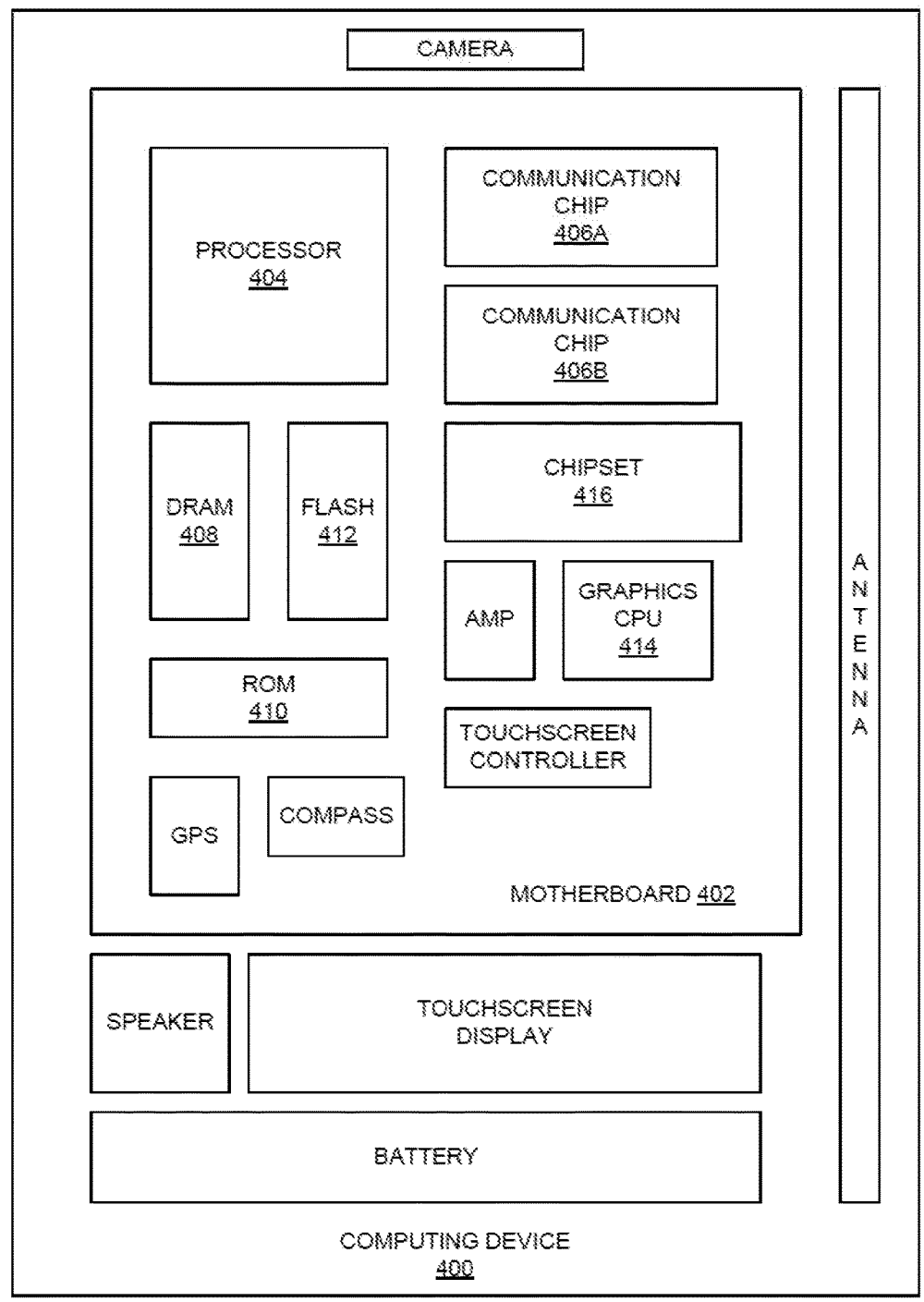
FIG. 18 illustrates a computing device in accordance with one implementation of the present description.

FIG. 18 illustrates a computing device 400 in accordance with one implementation of the present description. The computing device 400 houses a board 402. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chips 406A, 406B enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406A, 406B. For instance, a first communication chip 406A may be dedicated to shorter range wireless communications such as Wi-Fi and Bluetooth and a second communication chip 406B may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include microelectronic devices connected to one another with a microelectronic bridge embedded in a microelectronic substrate formed in accordance with implementations described above.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

It is understood that the subject matter of the present description is not necessarily limited to specific applications illustrated in FIGS. 1-18. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a method of forming a microelectronic structure may comprise forming a first and a second microelectronic device, wherein each of the first and the second microelectronic device include a plurality of high density interconnect structures and a plurality of lower density interconnect structures on an active surface thereof; attaching a microelectronic bridge to the plurality of high density interconnect structures of the first microelectronic device and to the plurality of high density interconnect structures of the second microelectronic device; forming a microelectronic substrate having a cavity defined therein extending from a first surface of the microelectronic substrate, wherein the cavity includes at least one sidewall and a bottom surface, and electrically attaching the plurality of lower density interconnect structures of the first microelectronic device and the plurality of lower density interconnect structures of the second microelectronic device to the first surface of the microelectronic substrate, wherein the microelectronic bridge extends into the microelectronic substrate cavity.

In Example 2, the subject matter of Example 1 can optionally include the microelectronic bridge electrically connects the first microelectronic device and the second microelectronic device.

In Example 3, the subject matter of Example 1 can optionally include the microelectronic bridge includes a plurality of conductive routes therein.

In Example 4, the subject matter of Example 1 can optionally include the microelectronic bridge includes at least one microelectronic device embedded therein.

In Example 5, the subject matter of Example 1 can optionally include disposing an underfill material between the first microelectronic device active surface and the microelectronic substrate first surface, between the second microelectronic device active surface and the microelectronic substrate first surface, and within the microelectronic substrate cavity.

In Example 6, the subject matter of any of Examples 1 to 5 can optionally include forming a reconstituted wafer from the first microelectronic device and the second microelectronic device prior to attaching the microelectronic bridge.

In Example 7, the subject matter of Example 6 can optionally include forming the reconstituted wafer comprising disposing an encapsulant material between at least one side of the first microelectronic device and at least one side of the second microelectronic device.

In Example 8, the subject matter of Example 7 can optionally include aligning the first microelectronic device and the second microelectronic device on a carrier with the active surface of each of the first microelectronic device and the second device facing the carrier; and wherein disposing the encapsulant material comprises disposing the encapsulant material over a back surface of the first microelectronic device and a back surface of the second microelectronic device.

In Example 9, the subject matter of Example 8 can optionally include aligning the first microelectronic device and the second microelectronic device on the carrier further comprises adhering the first microelectronic device and the second microelectronic device to the carrier with an adhesive layer.

In Example 10, the subject matter of Example 8 can optionally include removing a portion of the encapsulant material to expose the back surface of the first microelectronic device and the back surface of the second microelectronic device.

In Example 11, the subject matter of Example 10 can optionally include removing a portion of the first microelectronic device and the second microelectronic device.

In Example 12, the subject matter of any of Examples 1 to 5 can optionally include attaching the microelectronic bridge to the plurality of high density interconnect structures of the first microelectronic device and to the plurality of high density interconnect structures of the second microelectronic device comprises aligning a back surface of each of the first microelectronic device and the second microelectronic device on a carrier and attaching the microelectronic bridge.

In Example 13, the subject matter of Example 12 can optionally include disposing a flux material on the plurality of high density interconnect surface of the first microelectronic device and on the plurality of high density interconnect surface of the second microelectronic device; and attaching the microelectronic bridge through the flux material.

In Example 14, a microelectronic structure may comprise forming a first and a second microelectronic device, wherein each of the first and the second microelectronic device include a plurality of high density interconnect structures and a plurality of lower density interconnect structures on an active surface thereof; a microelectronic bridge attached to the plurality of high density interconnect structures of the first microelectronic device and to the plurality of high density interconnect structures of the second microelectronic device; a microelectronic substrate having a cavity defined therein extending from a first surface of the microelectronic substrate, wherein the cavity includes at least one sidewall and a bottom surface, wherein the plurality of lower density interconnect structures of the first microelectronic device and the plurality of lower density interconnect structures of the second microelectronic device are electrically attached to the first surface of the microelectronic substrate, and wherein the microelectronic bridge extends into the microelectronic substrate cavity; and an underfill material between the first microelectronic device active surface and the microelectronic substrate first surface, between the second microelectronic device active surface and the microelectronic substrate first surface, and within the microelectronic substrate cavity.

In Example 15, the subject matter of Example 14 can optionally include the microelectronic bridge electrically connecting the first microelectronic device and the second microelectronic device.

In Example 16, the subject matter of Example 14 can optionally include the microelectronic bridge including a plurality of conductive routes therein.

In Example 17, the subject matter of Example 14 can optionally include the microelectronic bridge including at least one microelectronic device embedded therein.

In Example 18, the subject matter of any of Examples 14 to 17 can optionally include a reconstituted wafer formed from the first microelectronic device and the second microelectronic device.

In Example 19, the subject matter of Example 18 can optionally include the reconstituted wafer including an encapsulant material between at least one side of the first microelectronic device and at least one side of the second microelectronic device.

In Example 20, the subject matter of Example 14 can optionally include a flux material disposed between the first microelectronic device and the microelectronic bridge, and between on the second microelectronic device and the microelectronic bridge.

In Example 21, a computing device may comprise a board and a microelectronic structure attached to the board, wherein the microelectronic structure comprises a first and a second microelectronic device, wherein each of the first and the second microelectronic device include a plurality of high density interconnect structures and a plurality of lower density interconnect structures on an active surface thereof; a microelectronic bridge attached to the plurality of high density interconnect structures of the first microelectronic device and to the plurality of high density interconnect structures of the second microelectronic device; a microelectronic substrate having a cavity defined therein extending from a first surface of the microelectronic substrate, wherein the cavity includes at least one sidewall and a bottom surface, wherein the plurality of lower density interconnect structures of the first microelectronic device and the plurality of lower density interconnect structures of the second microelectronic device are electrically attached to the first surface of the microelectronic substrate, and wherein the microelectronic bridge extends into the microelectronic substrate cavity; and an underfill material between the first microelectronic device active surface and the microelectronic substrate first surface, between the second microelectronic device active surface and the microelectronic substrate first surface, and within the microelectronic substrate cavity.

In Example 22, the subject matter of Example 21 can optionally include the microelectronic bridge electrically connecting the first microelectronic device and the second microelectronic device.

In Example 23, the subject matter of Example 21 can optionally include the microelectronic bridge including a plurality of conductive routes therein.

In Example 24, the subject matter of Example 21 can optionally include the microelectronic bridge including at least one microelectronic device embedded therein.

In Example 25, the subject matter of any of Examples 21 to 24 can optionally include a reconstituted wafer formed from the first microelectronic device and the second microelectronic device.

In Example 26, the subject matter of Example 25 can optionally include the reconstituted wafer including an encapsulant material between at least one side of the first microelectronic device and at least one side of the second microelectronic device.

In Example 27, the subject matter of Example 21 can optionally include a flux material disposed between the first microelectronic device and the microelectronic bridge, and between on the second microelectronic device and the microelectronic bridge.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A method of forming a microelectronic structure, comprising:
    forming a first and a second microelectronic device, wherein each of the first and the second microelectronic device include a plurality of high density interconnect structures and a plurality of lower density interconnect structures on an active surface thereof;
    attaching a microelectronic bridge to the plurality of high density interconnect structures of the first microelectronic device and to the plurality of high density interconnect structures of the second microelectronic device;
    forming a microelectronic substrate having a cavity defined therein extending from a first surface of the microelectronic substrate, wherein the cavity includes at least one sidewall and a bottom surface;
    electrically attaching the plurality of lower density interconnect structures of the first microelectronic device and the plurality of lower density interconnect structures of the second microelectronic device to the first surface of the microelectronic substrate, wherein the microelectronic bridge extends into the microelectronic substrate cavity; and
    disposing an underfill material between the first microelectronic device active surface and the microelectronic substrate first surface, between the second microelectronic device active surface and the microelectronic substrate first surface, and within the microelectronic substrate cavity.

2. The method of claim 1, wherein the microelectronic bridge electrically connects the first microelectronic device and the second microelectronic device.

3. The method of claim 1, wherein the microelectronic bridge includes a plurality of conductive routes therein.

4. The method of claim 1, wherein the microelectronic bridge includes at least one microelectronic device embedded therein.

5. A method of forming a microelectronic structure, comprising:
forming a first and a second microelectronic device, wherein each of the first and the second microelectronic device include a plurality of high density interconnect structures and a plurality of lower density interconnect structures on an active surface thereof;
forming a reconstituted wafer from the first microelectronic device and the second microelectronic device;
attaching a microelectronic bridge to the reconstituted wafer, wherein the microelectronic bridge is attached to the plurality of high density interconnect structures of the first microelectronic device and to the plurality of high density interconnect structures of the second microelectronic device;
forming a microelectronic substrate having a cavity defined therein extending from a first surface of the microelectronic substrate, wherein the cavity includes at least one sidewall and a bottom surface; and
electrically attaching the plurality of lower density interconnect structures of the first microelectronic device and the plurality of lower density interconnect structures of the second microelectronic device to the first surface of the microelectronic substrate, wherein the microelectronic bridge extends into the microelectronic substrate cavity.

6. The method of claim 5, wherein forming the reconstituted wafer comprises disposing an encapsulant material between at least one side of the first microelectronic device and at least one side of the second microelectronic device.

7. The method of claim 6, further including aligning the first microelectronic device and the second microelectronic device on a carrier with the active surface of each of the first microelectronic device and the second device facing the carrier; and wherein disposing the encapsulant material comprises disposing the encapsulant material over a back surface of the first microelectronic device and a back surface of the second microelectronic device.

8. The method of claim 7, wherein aligning the first microelectronic device and the second microelectronic device on the carrier further comprises adhering the first microelectronic device and the second microelectronic device to the carrier with an adhesive layer.

9. The method of claim 7, further comprising removing a portion of the encapsulant material to expose the back surface of the first microelectronic device and the back surface of the second microelectronic device.

10. The method of claim 9, further comprising removing a portion of the in the first microelectronic device and the second microelectronic device.

11. A method forming a microelectronic structure, comprising:
forming a first and a second microelectronic device, wherein each of the first and the second microelectronic device include a plurality of high density interconnect structures and a plurality of lower density interconnect structures on an active surface thereof;
attaching a microelectronic bridge to the plurality of high density interconnect structures of the first microelectronic device and to the plurality of high density interconnect structures of the second microelectronic device;
forming a microelectronic substrate having a cavity defined therein extending from a first surface of the microelectronic substrate, wherein the cavity includes at least one sidewall and a bottom surface; and
electrically attaching the plurality of lower density interconnect structures of the first microelectronic device and the plurality of lower density interconnect structures of the second microelectronic device to the first surface of the microelectronic substrate, wherein the microelectronic bridge extends into the microelectronic substrate cavity;
wherein attaching the microelectronic bridge to the plurality of high density interconnect structures of the first microelectronic device and to the plurality of high density interconnect structures of the second microelectronic device comprises:
aligning a back surface of each of the first microelectronic device and the second microelectronic device on a carrier;
disposing a flux material on the plurality of high density interconnect surface of the first microelectronic device and on the plurality of high density interconnect surface of the second microelectronic device; and
attaching the microelectronic bridge through the flux material.

12. A microelectronic structure comprising:
a first and a second microelectronic device, wherein each of the first and the second microelectronic device includes a plurality of high density interconnect structures and a plurality of lower density interconnect structures on an active surface thereof;
a microelectronic bridge attached to the plurality of high density interconnect structures of the first microelectronic device and to the plurality of high density interconnect structures of the second microelectronic device;
a microelectronic substrate having a cavity defined therein extending from a first surface of the microelectronic substrate, wherein the cavity includes at least one sidewall and a bottom surface, wherein the plurality of lower density interconnect structures of the first microelectronic device and the plurality of lower density interconnect structures of the second microelectronic device are electrically attached to the first surface of the microelectronic substrate, and wherein the microelectronic bridge extends into the microelectronic substrate cavity; and
an underfill material between the first microelectronic device active surface and the microelectronic substrate first surface, between the second microelectronic device active surface and the microelectronic substrate first surface, and within the microelectronic substrate cavity.

13. The microelectronic structure of claim 12, wherein the microelectronic bridge electrically connects the first microelectronic device and the second microelectronic device.

14. The microelectronic structure of claim 12, wherein the microelectronic bridge includes a plurality of conductive routes therein.

15. The microelectronic structure of claim 12, wherein the microelectronic bridge includes at least one microelectronic device embedded therein.

16. The microelectronic structure of claim 12, further comprising a reconstituted wafer formed from the first microelectronic device and the second microelectronic device.

17. The microelectronic structure of claim 16, wherein the reconstituted wafer includes an encapsulant material between at least one side of the first microelectronic device and at least one side of the second microelectronic device.

18. The microelectronic structure of claim 12, further comprising a flux material disposed between the first microelectronic device and the microelectronic bridge, and between on the second microelectronic device and the microelectronic bridge.

19. A computing device, comprising:
a board;
a microelectronic structure attached to the board, wherein the microelectronic structure comprises:
 a first and a second microelectronic device, wherein each of the first and the second microelectronic device includes a plurality of high density interconnect structures and a plurality of lower density interconnect structures on an active surface thereof;
 a microelectronic bridge attached to the plurality of high density interconnect structures of the first microelectronic device and to the plurality of high density interconnect structures of the second microelectronic device;
 a microelectronic substrate having a cavity defined therein extending from a first surface of the microelectronic substrate, wherein the cavity includes at least one sidewall and a bottom surface, wherein the plurality of lower density interconnect structures of the first microelectronic device and the plurality of lower density interconnect structures of the second microelectronic device are electrically attached to the first surface of the microelectronic substrate, and wherein the microelectronic bridge extends into the microelectronic substrate cavity; and
 an underfill material between the first microelectronic device active surface and the microelectronic substrate first surface, between the second microelectronic device active surface and the microelectronic substrate first surface, and within the microelectronic substrate cavity.

20. The computing device of claim 19, wherein the microelectronic bridge electrically connects the first microelectronic device and the second microelectronic device.

21. The computing device of claim 19, further comprising a reconstituted wafer formed from the first microelectronic device and the second microelectronic device.

22. The computing device of claim 21, wherein the reconstituted wafer includes an encapsulant material between at least one side of the first microelectronic device and at least one side of the second microelectronic device.

23. The computing device of claim 19, further comprising a flux material disposed between the first microelectronic device and the microelectronic bridge, and between on the second microelectronic device and the microelectronic bridge.

* * * * *